United States Patent [19]
Van De Plassche

[11] Patent Number: 5,021,744
[45] Date of Patent: Jun. 4, 1991

[54] DIFFERENTIAL AMPLIFIER WITH DIFFERENTIAL OR SINGLE-ENDED OUTPUT

[75] Inventor: Rudy J. Van De Plassche, Eindhoven, Netherlands

[73] Assignee: U.S. Philips Corporation, New York, N.Y.

[21] Appl. No.: 463,753

[22] Filed: Jan. 12, 1990

[30] Foreign Application Priority Data

Feb. 14, 1989 [NL] Netherlands .......................... 8900348

[51] Int. Cl.$^5$ .............................................. H03F 3/45
[52] U.S. Cl. ...................................... 330/252; 330/257
[58] Field of Search ............... 330/252, 257, 261, 288, 330/296, 301

[56] References Cited

U.S. PATENT DOCUMENTS 4,547,744 10/1985 Kasperkovitz ...................... 330/261
4,951,003 8/1990 De Jager et al. .................... 330/252

Primary Examiner—Steven Mottola
Attorney, Agent, or Firm—Bernard Franzblau

[57] ABSTRACT

In a differential amplifier the input signal is applied between a first input terminal (1), formed by the bases of a first (T1) and a third (T3) transistor, and a second input terminal (2), formed by the bases of a second (T2) and a fourth (T4) transistor. The emitters of the third and the fourth transistor are coupled to a first supply-voltage terminal (Vee) by means of a first (J1) and a second (J2) current source, respectively, and to the mutually coupled emitters of the first and the second transistor by means of a first (R1) and a second (R2) resistor. The collectors of the third and the fourth transistor are coupled to a second supply voltage terminal (Vcc) by means of both a fifth resistor (R5) and the base-collector junction of a fifth transistor (T5). The collectors of the first and the second transistors constitute the first (3) and the second (4) output terminal, respectively, and are coupled to the emitter of the fifth transistor by means of a third (R3) and a fourth (R4) resistor. By providing a correct bias, the output voltages will exhibit class-A behaviour so that both a single-ended and a differential signal can be readily obtained.

5 Claims, 3 Drawing Sheets

DIFFERENTIAL AMPLIFIER WITH DIFFERENTIAL OR SINGLE-ENDED OUTPUT

BACKGROUND OF THE INVENTION

This invention relates to a differential amplifier comprising a first and a second transistor having collectors coupled to a common terminal by means of a load and having their mutually coupled emitters coupled to a first supply-voltage terminal via a first resistor and a first current source and via a second resistor and a second current source. The coupled emitters are also coupled to the emitter of a third transistor via said first resistor. The third transistor has its base coupled to the base of the first transistor and to a first input terminal. The coupled emitters are further coupled to the emitter of a fourth transistor via said second resistor. The, which fourth transistor has its base coupled to the base of the second transistor and to a second input terminal.

Such a differential amplifier can be used in integrated semiconductor circuits and, in particular, in fast analog-to-digital converters, operational amplifiers and sample-and-hold circuits.

Such a differential amplifier is known from U.S. Pat. No. 4,616,190. In this known amplifier the first and second transistor form a differential pair to which the emitter currents are supplied by the first and the second current source via the first and the second resistor. The third and fourth transistor, together with the first and the second resistor, constitute an emitter-degenerated differential pair whose bias currents are also supplied by the first and the second current source. The collectors of the first and the second transistor are each coupled to a second supply voltage terminal via a resistor and the collectors of the third and the fourth transistor are connected directly to this supply-voltage terminal. The output signal is taken from the collectors of the first and the second transistor. In the balanced state, in which the voltage difference between the input terminals is zero volts, the currents through the first and the second transistor are substantially equal to each other, which is also the case with the currents through the third and the fourth transistor. In the case of a positive voltage difference between the first and the second input terminal the currents through the first and the third transistor increase and the currents through the second and the fourth transistor decrease. The current increase is provided by the second current source via the second resistor. If the input voltage increases the second transistor will be cut off first. The fourth transistor remains conductive for the time being so that the current through the first transistor can still increase via the second resistor. In this way the driving range of the first transistor is extended, until the fourth transistor is also cut off. A similar response is obtained if the input voltage has the opposite polarity. Since the voltage between the output terminals and the first supply voltage terminal should always be adequate to allow a correct operation of the intermediate elements, the two output potentials can never become equal to said supply voltage. However, the output voltages can become equal to the voltage on the second supply voltage terminal. This results in a class AB behaviour of the output voltages, which do not intersect in the centre of the output characteristic. A single-ended class A output signal, for which the balanced state is situated in the centre of the output characteristic, can be otained only if the load is constituted by a current mirror.

SUMMARY OF THE INVENTION

Therefore, it is an object of the invention to provide a differential amplifier which enables both a single-ended and a differential class A signal to be taken directly from its outputs.

In accordance with the invention a differential amplifier of the type defined in the opening paragraph is characterized in that the collectors of the third and the fourth transistor are coupled to a second supply voltage terminal by means of a common third resistor and to the base of a fifth transistor. The fifth transistor has its emitter coupled to the common terminal and its collector coupled to the second supply-voltage terminal.

The invention is based on the recognition of the fact that by means of the fifth transistor the current through the third resistor is isolated from the current through the first and the second transistor, which is added via the first or the second resistor. In the case of a correct bias this results in the output voltages intersecting in the centre of the output characteristic, which corresponds to class A operation. Therefore, 2 single-ended signals or a differential output signal can now be obtained without any problems.

A first embodiment of a differential amplifier in accordance with the invention may be characterized in that the collectors of the first and the second transistor are coupled to the common terminal by means of a fourth and a fifth resistor respectively.

A second embodiment of a differential amplifier in accordance with the invention may be characterized in that the collectors of the first and the second transistor are coupled to the common terminal by means of a current mirror.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1:
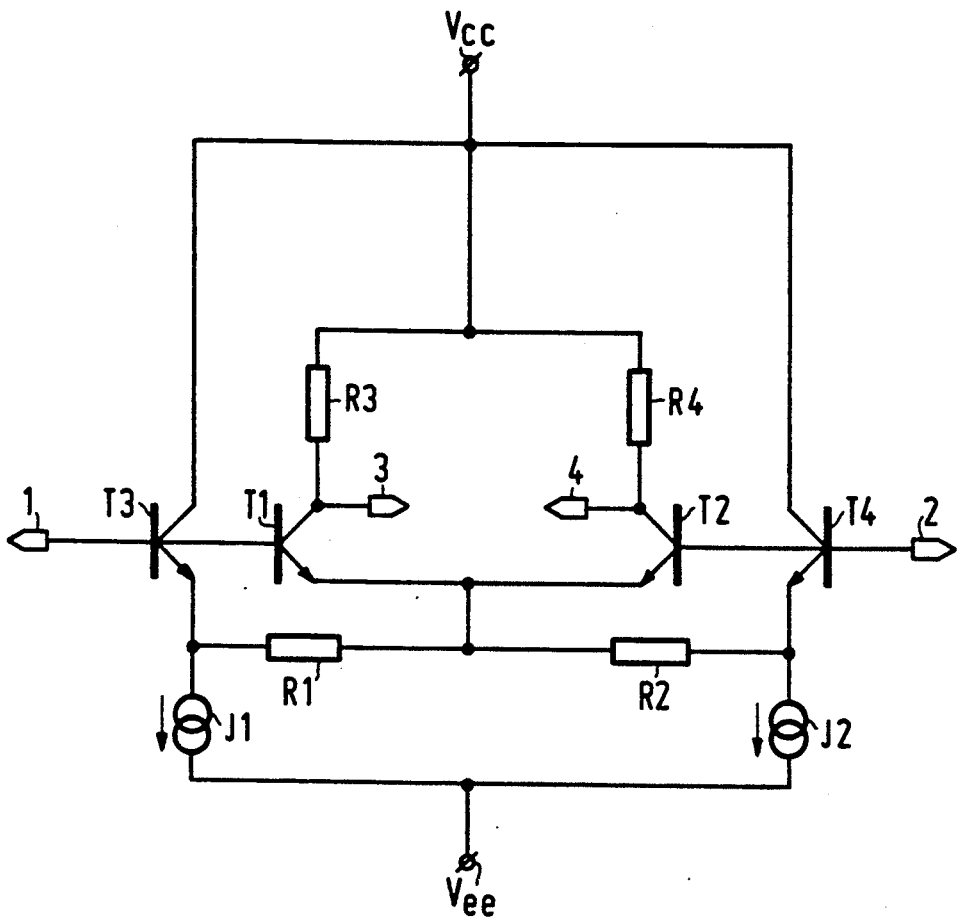
FIG. 1 shows a prior art differential amplifier.

FIG. 1 shows a prior art differential amplifier. In this amplifier the input voltage is coupled to a first and a second input terminal 1 and 2, constituted by the bases of a transistor T1 and a transistor T3 and the bases of a transistor T2 and a transistor T4, respectively. The emitters of the transistors T1 and T2 are coupled to one another, to a first supply voltage terminal Vee by means of a resistor R1 and by means of a current source J1 and by a resistor R2 and current source J2, respectively, and to the emitters of the transistors T3 and T4 by means of said resistors R1 and R2, respectively. The collectors of the transistors T3 and T4 are coupled to a second supply voltage terminal Vcc. This terminal is also coupled to the collector of the transistor T1 via a resistor R3, which collector constitutes a first output terminal 3, and to the collector of the transistor T2 via a resistor R4, which collector constitutes a second output terminal 4. In the balanced state equal currents will flow through the elements R1, T1 and R3, through the elements R2, T2 and R4, and also through the transistors T3 and T4. The voltage difference between the output terminals is then substantially zero volts. This will change in the case of, for example, a positive voltage difference between the input terminals 1 and 2. The currents through the transistors T1 and T3 then increase and, conversely, those through T2 and T4 decrease. The additional current then flows to the current source J2 via the resistor R2. When the input voltage difference increases further the transistor T2 will reach a point where it is turned off while the transistor T4 still conducts. Since the current source J2 supplies additional current to the transistor T1, the driving range is extended as compared with a single differential pair. When the transistor T4 is also cut off the current through the transistors T1 and T3 reach their maximum. In the case of an opposite polarity of the input voltage difference, the driving range of the transistor T2 is extended in a similar way, the transistors T1 and T3 then being cut off successively.

Figure 2:
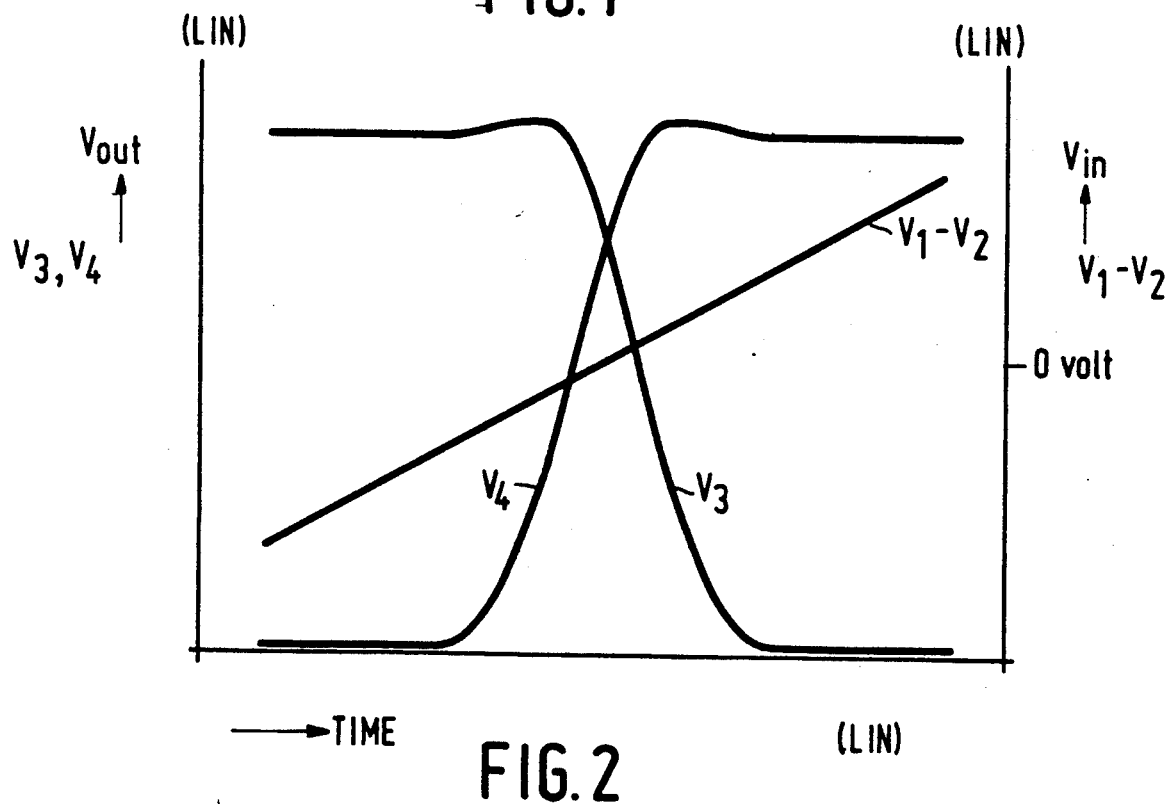
FIG. 2 shows a characteristic curve of the output voltage as a function of the input voltage for a configuration as shown in FIG. 1.

In FIG. 2 the output voltages at the terminals 3 and 4, referred to as V3 and V4, respectively, are plotted as a function of the voltage difference V1−V2 between the input terminals 1 and 2. The two output voltages then do not intersect in the centre of this characteristic, which corresponds to a class AB behaviour. If, at an increasing input voltage one output voltage is already limited, the other output voltage can still increase for a considerable time. A class A output signal can then be obtained only when a current mirror is used for the load.

Figure 3:
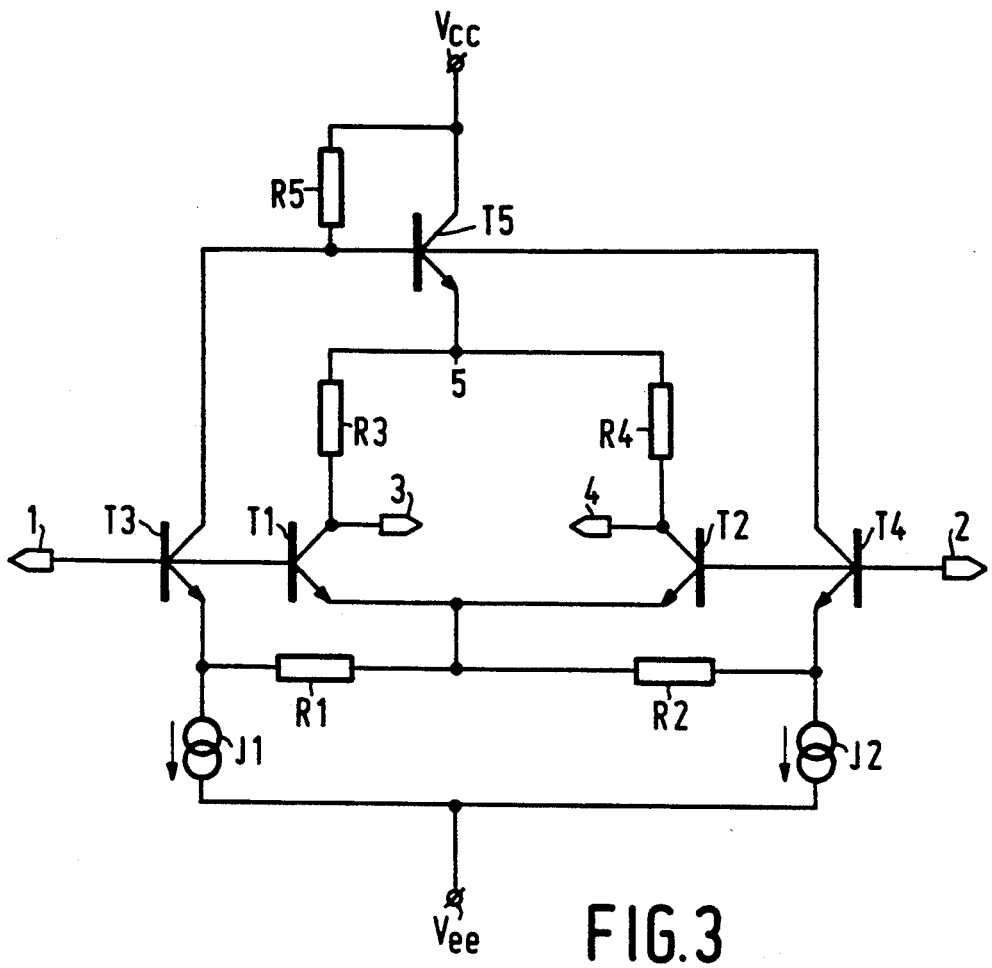
FIG. 3 shows a first embodiment of a differential amplifier in accordance with the invention.

FIG. 3 shows a first embodiment of a differential amplifier in accordance with the invention, identical parts bearing the same reference numerals as in FIG. 1. Now the collectors of the transistors T3 and T4 are coupled to the second supply-voltage terminal Vcc by means of both a resistor R5 and the base-collector junction of a transistor T5. The common terminal 5 is formed by the node between the coupled collectors of the transistors T1 and T2 and is coupled to the emitter of the transistor T5. Consequently, the sum of the currents through the transistors T3 and T4 will flow through the resistor R5 and the sum of the currents through the transistors T1 and T2 will flow through the transistor T5. The potential on the output terminals 3 and 4 is dictated by the overall voltage drop across the resistor R5, the base-emitter junction of the transistor T5 and the substantially equal resistance of resistor R3 or R4. In the case of a suitable dimensioning this potential will be situated in the centre of the overall output-voltage swing, thus enabling class A operation to be obtained. The required residual voltage between the output terminals and the second supply voltage terminal Vcc in the case of the maximum output contributes to this.

Figure 4:
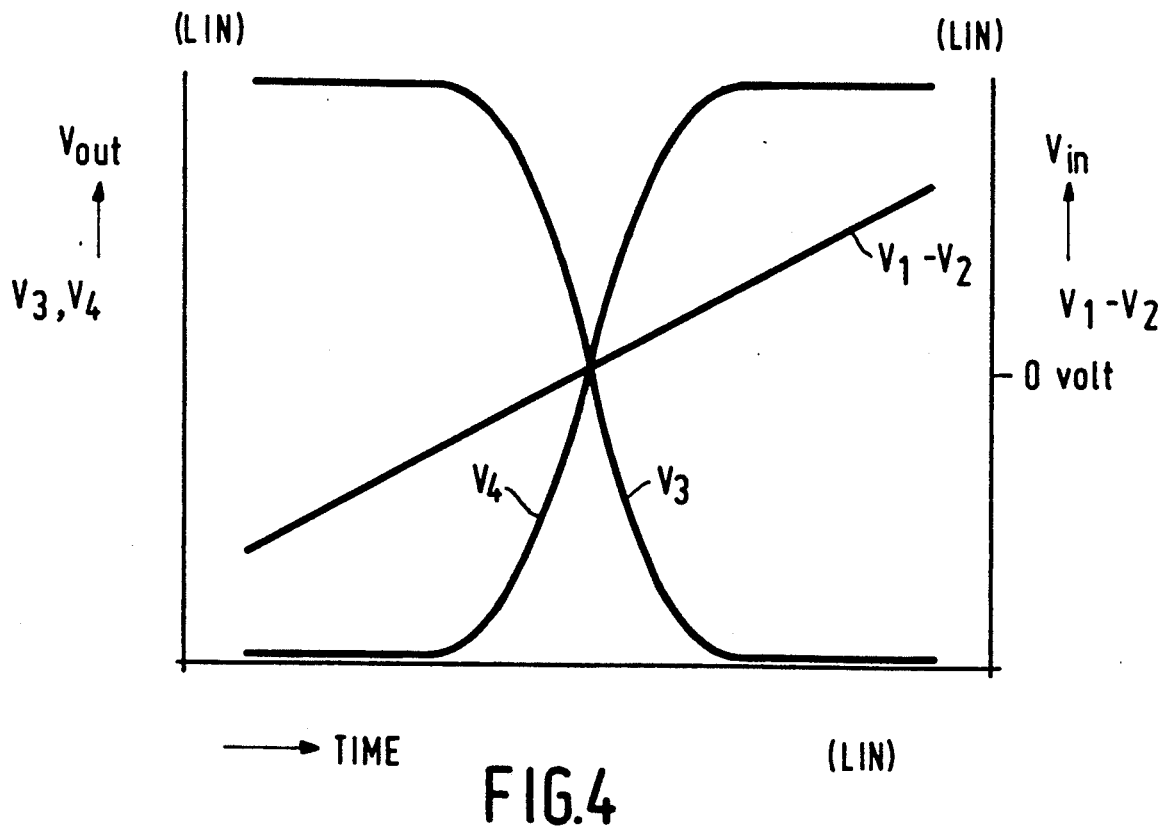
FIG. 4 shows a characteristic curve of the output voltage as a function of the input voltage for a configuration as shown in FIG. 3.

FIG. 4 shows the output voltages V3 and V4 as a function of the voltage difference V1−V2 between the input terminals 1 and 2. The output voltages intersect at the center of the characteristic, enabling a single-ended signal to be obtained having the same output-voltage swing as a differential output signal.

Figure 5:
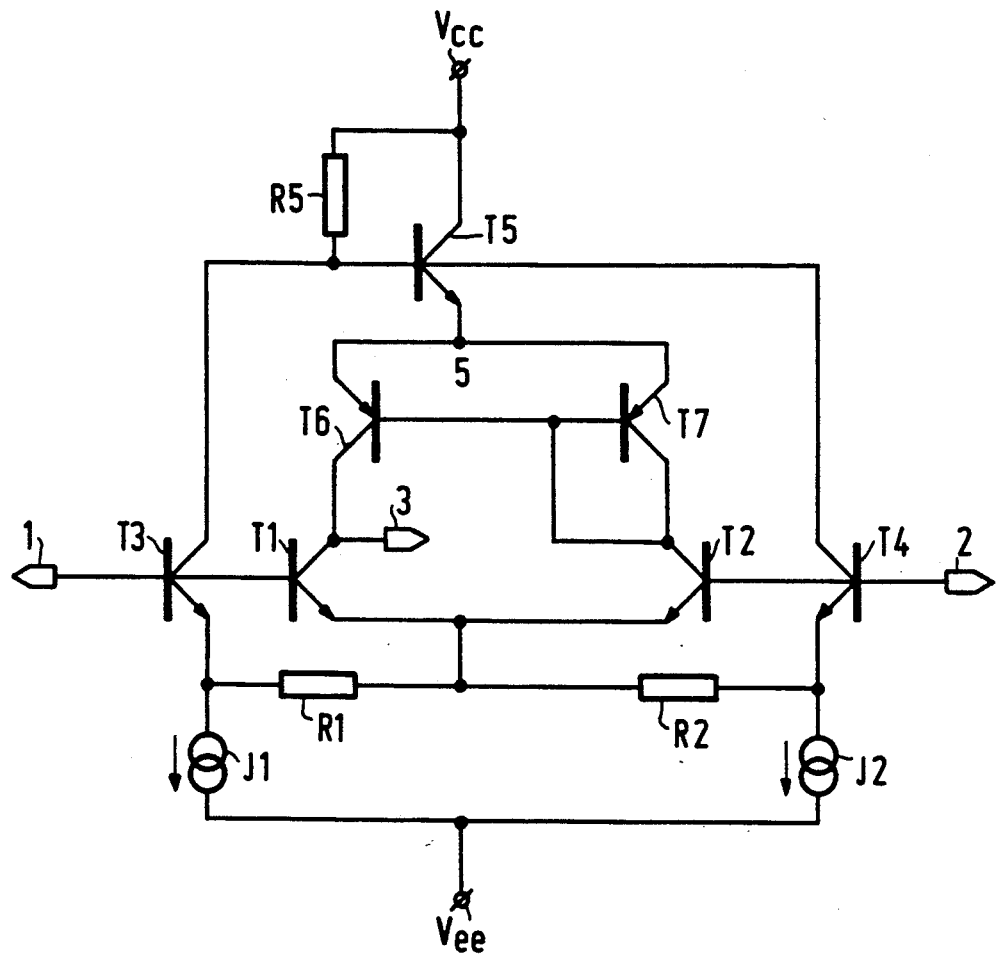
FIG. 5 shows a second embodiment of a differential amplifier in accordance with the invention.

FIG. 5 shows a second embodiment of a differential amplifier in accordance with the invention, identical parts bearing the same reference numerals as in FIG. 3. However, the resistors R3 and R4 are not replaced by pnp-transistors T6 and T7 respectively, whose emitters are coupled to the common terminal 5. The base of the transistor T6 is coupled to both the base and the collector of the transistor T7 and to the collector of the transistor T2. The collector of the transistor T6 is coupled to the collector of the transistor T1 and also constitutes the output terminal 3. A difference current equal to the current through the transistor T6 minus the current through the transistor T1 can be obtained from this terminal.

The invention is not limited to the embodiments shown herein. Within the scope of the invention several modifications will be conceivable to those skilled in the art, such as for example the use of Darlington transistors instead of non-compound transistors, or the use of a different load. It is also possible to use pnp or unipolar transistors. In the last-mentioned case collector, base and emitter in the appended claims should read drain, gate and source, respectively.

What is claimed is:

1. A differential amplifier comprising: a first and a second transistor having their collectors coupled to a common terminal by means of a load and having their mutually coupled emitters coupled to a first supply voltage terminal via a first resistor and a first current source and via a second resistor and a second current source, to an emitter of a third transistor via said first resistor, said third transistor having its base coupled to a base of the first transistor and to a first input terminal, said mutually coupled emitters being coupled to an emitter of a fourth transistor via said second transistor, said fourth transistor having its base coupled to a base of the second transistor and to a second input terminal, characterized in that collectors of the third and the fourth transistors are coupled to a second supply-voltage terminal by means of a common third resistor and to a base of a fifth transistor having its emitter coupled to the common terminal and its collector coupled to the second supply voltage terminal.

2. A differential amplifier as claimed in claim 1, characterized in that collectors of the first and the second transistors are coupled to the common terminal by means of a fourth resistor and a fifth resistor, respectively.

3. A differential amplifier as claimed in claim 1, characterized in that collectors of the first and the second transistors, are coupled to the common terminal by means of a current mirror.

4. A differential amplifier as claimed in claim 1 further comprising signal output means coupled to the collectors of the first and second transistors.

5. A differential amplifier as claimed in claim 1 wherein said transistors are biased so that first and second output characteristic curves of output voltages at the collectors of the first and second transistors, respectively, intersect at the center of each characteristic curve thereby to provide class A operation of the differential amplifier.

* * * * *